United States Patent
Miura et al.

(10) Patent No.: US 9,685,570 B2
(45) Date of Patent: Jun. 20, 2017

(54) LIGHT RECEIVING APPARATUS, METHOD FOR FABRICATING LIGHT RECEIVING APPARATUS

(71) Applicant: SUMITOMO ELECTRIC INDUSTRIES, LTD., Osaka (JP)

(72) Inventors: Kohei Miura, Yokohama (JP); Yasuhiro Iguchi, Yokohama (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 0 days.

(21) Appl. No.: 15/227,644

(22) Filed: Aug. 3, 2016

(65) Prior Publication Data

US 2017/0040476 A1 Feb. 9, 2017

(30) Foreign Application Priority Data

Aug. 6, 2015 (JP) ................. 2015-156229

(51) Int. Cl.
| | |
|---|---|
| H01L 31/00 | (2006.01) |
| H01L 31/0352 | (2006.01) |
| H01L 27/146 | (2006.01) |
| H01L 31/0304 | (2006.01) |
| H01L 31/18 | (2006.01) |

(52) U.S. Cl.
CPC ........ *H01L 31/035236* (2013.01); *H01L 27/14649* (2013.01); *H01L 31/0304* (2013.01); *H01L 31/184* (2013.01)

(58) Field of Classification Search
None
See application file for complete search history.

(56) References Cited

U.S. PATENT DOCUMENTS

| | | | | |
|---|---|---|---|---|
| 5,477,047 A | * | 12/1995 | Nakagawa | .......... H04N 1/0316 |
| | | | | 250/208.1 |
| 5,506,451 A | * | 4/1996 | Hyugaji | ................. H01L 24/10 |
| | | | | 257/448 |

(Continued)

OTHER PUBLICATIONS

M. Walther et al., "Growth of InAs/GaSb short-period superlattices for high-resolution mid-wavelength infrared focal plane array detectors", Journal of Crystal Growth 278 (2005), p. 156-p. 161.

*Primary Examiner* — Thao P Le
(74) *Attorney, Agent, or Firm* — Smith, Gambrell & Russell, LLP.

(57) ABSTRACT

A light receiving apparatus includes a light receiving device including a compound semiconductor substrate, photodiodes, and bump electrodes; and a semiconductor integrated device including a silicon substrate and read-out circuits. Bonded, the integrated device and the light receiving device face each other in a direction of a first axis through the bump electrodes. The light receiving device has a back surface with first and second back edges extending in a direction of a second axis intersecting with the first axis. The light receiving device has a first slope face extending from the first back edge along a first reference plane, and a second slope face extending from the second back edge along a second reference plane. The back surface of the light receiving device extends along a third reference plane intersecting with the first axis. The first and second reference planes are inclined with respect to the third reference plane.

8 Claims, 11 Drawing Sheets

(56) References Cited

U.S. PATENT DOCUMENTS

| | | | |
|---|---|---|---|
| 2010/0148040 A1* | 6/2010 | Sanfilippo | H01L 31/1075 250/214.1 |
| 2010/0171097 A1* | 7/2010 | Nagai | H01L 24/11 257/21 |
| 2011/0147707 A1* | 6/2011 | Inada | H01L 27/14618 257/21 |

* cited by examiner

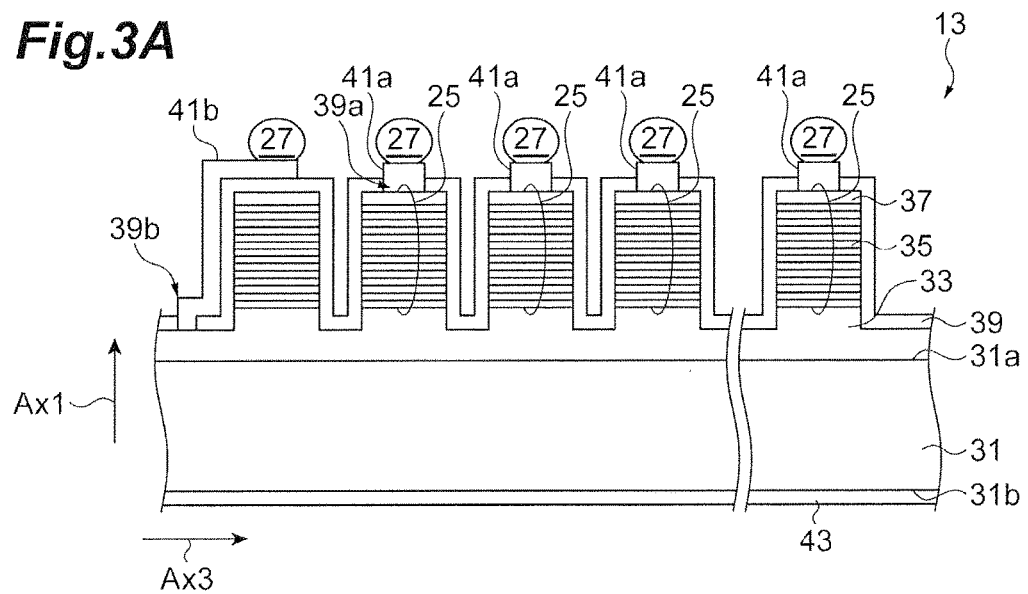
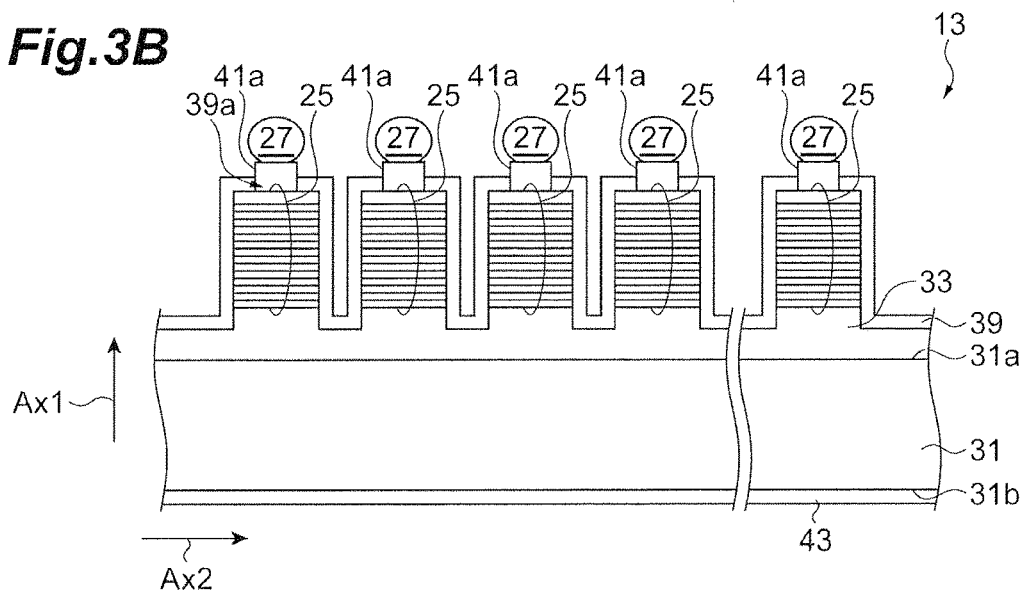

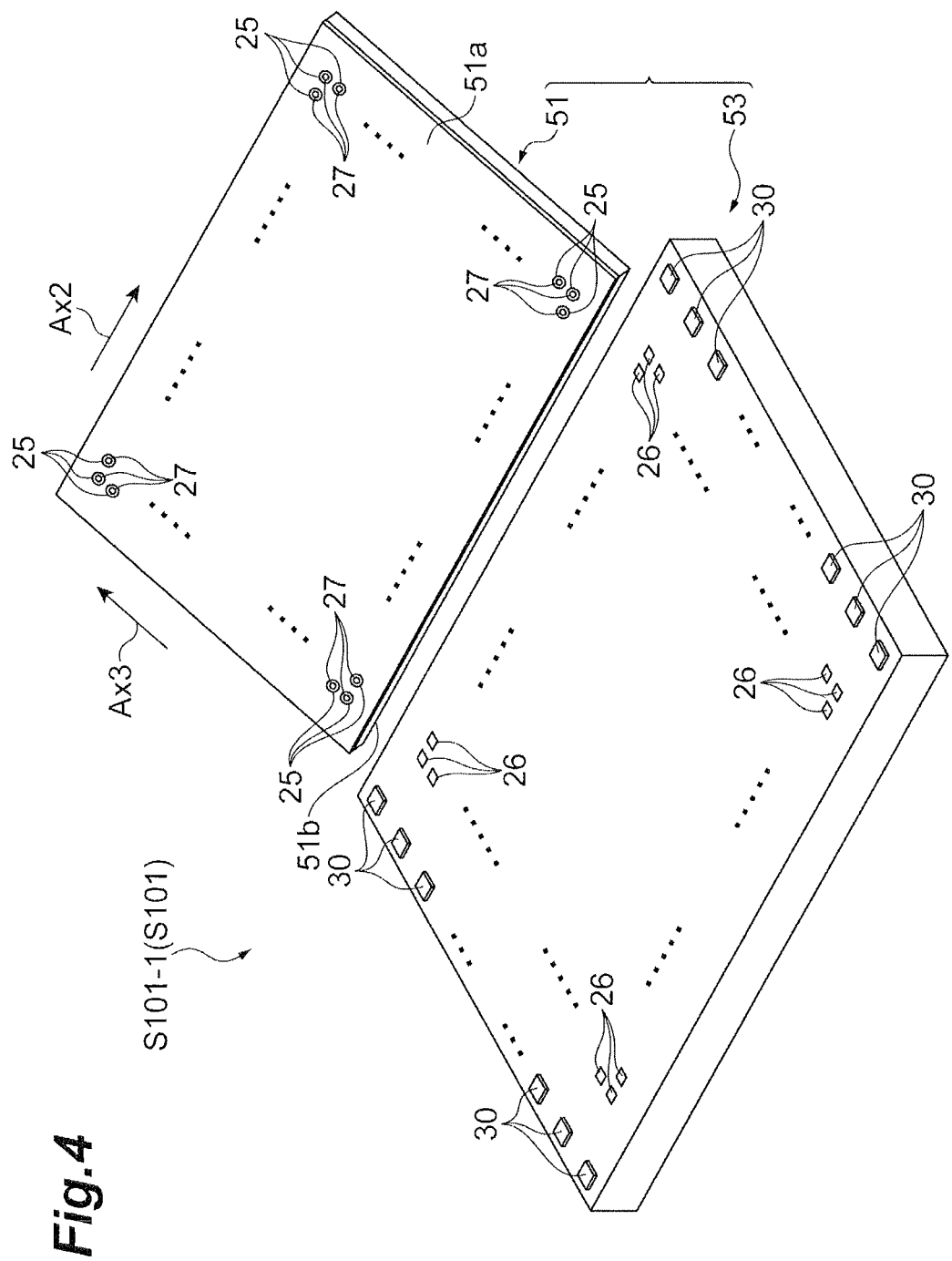

LIGHT RECEIVING APPARATUS, METHOD FOR FABRICATING LIGHT RECEIVING APPARATUS

BACKGROUND OF THE INVENTION

Field of the Invention

The present invention relates to a light receiving apparatus, and a method of fabricating a light receiving apparatus. This application claims the benefit of priority from Japanese Patent Application No. 2015-156229 filed on Aug. 6, 2015, which is herein incorporated by reference in its entirety.

Related Background Art

Non-Patent Document (M. Walther et al., Journal of Crystal Growth 278 (2005) 156-161, "Growth of InAs/GaSb short-period super-lattices for high resolution mid-wavelength infrared focal plane array detectors") discloses a two-dimensional sensor array which includes a light receiving layer having an InAs/GaSb superlattice of the cut-off wavelength 5 micrometers.

SUMMARY OF THE INVENTION

A light receiving apparatus according to one aspect of the present invention includes a light receiving device including a compound semiconductor substrate having a principal surface, a plurality of photodiodes each having an electrode, and a plurality of bump electrodes each of which is connected to at least one of the electrodes of the photodiodes, the photodiodes being arranged to form an array on the principal surface of the compound semiconductor substrate; and a semiconductor integrated device including a silicon substrate and a plurality of read-out circuits arranged to form an array on the silicon substrate, each of the read-out circuits having an electrode that is electrically connected to the electrode of the corresponding photodiode in the light receiving device through the bump electrode. The semiconductor integrated device is bonded with the light receiving device so as to face each other in a direction of a first axis through the bump electrodes. The light receiving device has a back surface with a first back edge and a second back edge that extend in a direction of a second axis intersecting with the first axis. The light receiving device has a first slope face extending from the first back edge along a first reference plane, and a second slope face extending from the second back edge along a second reference plane. The back surface of the light receiving device extends along a third reference plane intersecting with the first axis. In addition, the first reference plane and the second reference plane are inclined with the third reference plane.

A method for fabricating a light receiving apparatus according to another aspect of the present invention includes the steps of: preparing a light receiving device chip including a compound semiconductor substrate with a principal surface, a plurality of photodiodes arrayed on the principal surface of the compound semiconductor substrate, and a plurality of bump electrodes formed on electrodes of the photodiodes, the light receiving device chip having a back surface with a first edge and a second edge; preparing a semiconductor integrated device chip including a silicon substrate with a principal surface, and a plurality of read-out circuits arrayed on the principal surface of the silicon substrate; forming a laminated device by bonding the light receiving device chip with the semiconductor integrated device chip while facing each other in a direction of a first axis through the bump electrodes of the light receiving device chip; and forming a light receiving device having a first side surface and a second side surface by applying a mechanical machining to the first edge and the second edge of the back surface of the light receiving device chip. The light receiving device includes a back surface with a first back edge and a second back edge that extend in a direction of a second axis intersecting with the first axis. The first side surface of the light receiving device extends from the first back edge along a first reference plane. The second side surface of the light receiving device extends from the second back edge along a second reference plane. The back surface of the light receiving device extends along a third reference plane intersecting with the first axis. In addition, the first reference plane and the second reference plane are inclined with the third reference plane.

BRIEF DESCRIPTION OF THE DRAWINGS

The above-described objects and the other objects, features, and advantages of the present invention become more apparent from the following detailed description of the preferred embodiments of the present invention proceeding with reference to the attached drawings.

FIG. 3A is a schematic cross sectional view showing photodiodes, arranged in a direction of an axis Ax3, of a light receiving device, and bump electrodes disposed thereon. FIG. 3B is a schematic cross sectional view showing photodiodes, arranged in a direction of an axis Ax2, of a light receiving device, and bump electrodes disposed thereon.

FIG. 4 is a schematic view showing a product in a major step in a method of fabricating a light receiving apparatus according to the present embodiment.

DESCRIPTION OF EMBODIMENTS

Figure 1:
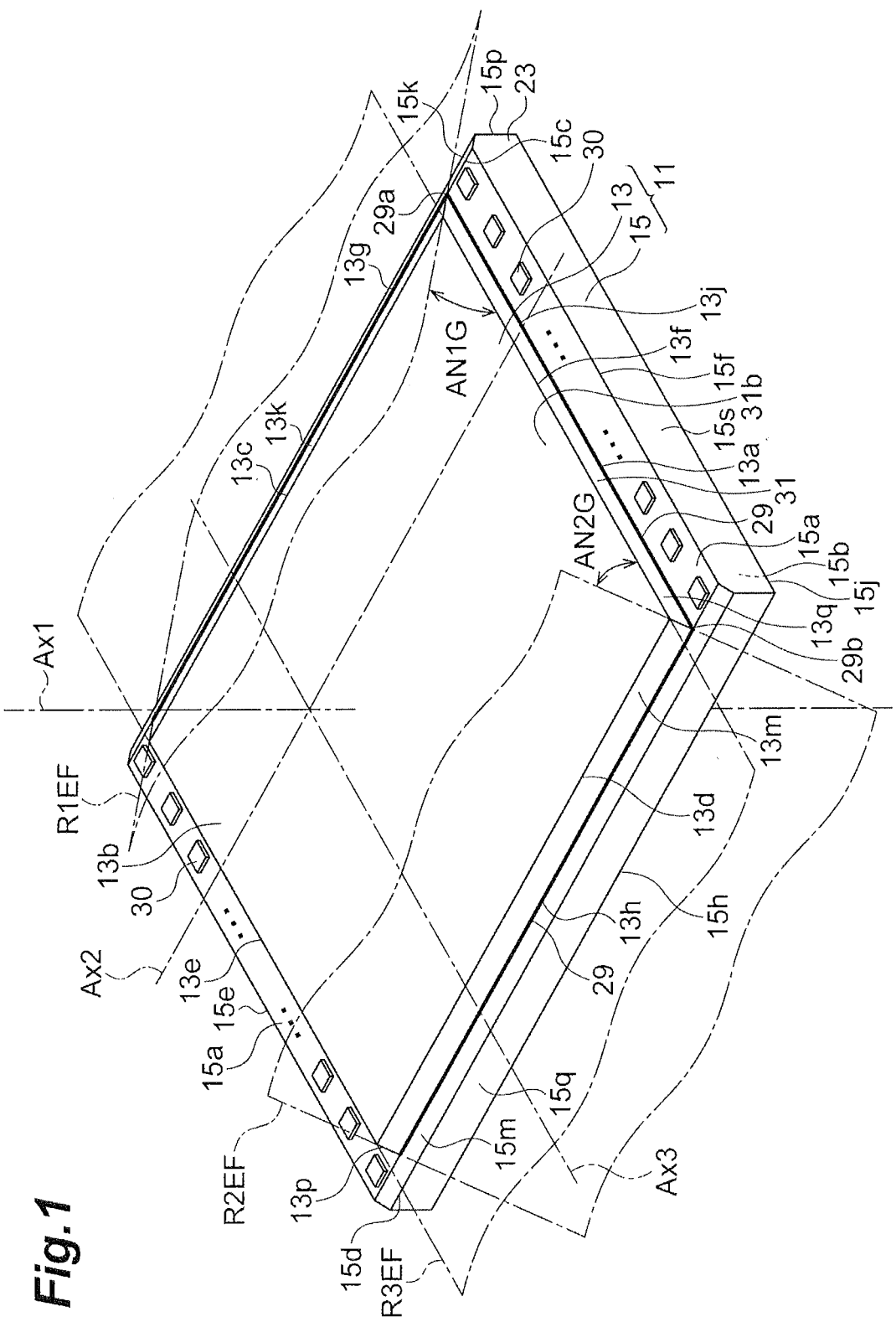
FIG. 1 is a diagrammatic perspective view showing a light receiving apparatus according to an embodiment of the present invention.

The two-dimensional sensor array as disclosed by Non-Patent Document (M. Walther et al., Journal of Crystal Growth 278 (2005) 156-161, "Growth of InAs/GaSb short-period super-lattices for high resolution mid-wavelength infrared focal plane array detectors") may include a light receiving apparatus with photodiodes. Light is incident on the back surface of a light receiving device of the light receiving apparatus to reach the photodiodes through the compound semiconductor substrate of the light receiving device. For the reception of the incident light, the back surface of the light receiving device appears at the outer surface of the light receiving apparatus. The light incident on the back surface propagates in the light receiving device, and before reaching the photodiodes, a part of the light may be absorbed by the compound semiconductor substrate. The compound semiconductor substrate has such a thickness as to reduce the amount of the absorption light to a desired level. The compound semiconductor substrate is derived from a support working as a base on which semiconductor layers for the photodiodes are to be grown in a process of fabricating the light receiving device and working as a base supporting the semiconductor layers thus grown. The thickness required for the base supporting the semiconductor layers grown thereon is greater than the thickness that meets the demand of reducing the optical absorption. The thickness of the compound semiconductor substrate has to be thin enough to meet the requirements of reducing the optical absorption in the light receiving apparatus. The thinned compound semiconductor substrate alone has smaller mechanical strength as compared with the original support (compound semiconductor substrate) having the thickness of, for example, 200 to 650 micrometers. In order to reduce the thickness of the compound semiconductor substrate, after the light receiving device and a semiconductor integrated device are bonded with each other, the original support (compound semiconductor substrate) in the product thus formed is processed by, for example, chemical mechanical polishing, mechanical polishing and grinding and chemical treatment, using the semiconductor integrated device as a supporting tool, thereby producing the compound semiconductor substrate with a desired thickness.

The compound semiconductor thinned in a process of thinning the support of the light receiving device in the method of fabricating the light receiving device chip is easy to break in temperature change, such as temperature rise or fall of the light receiving apparatus. Specifically, for the thinning, the compound semiconductor is subjected to processing, such as polishing or etching. The light receiving apparatus may be cooled to a temperature lower than room temperature, for example, to temperatures below the absolute temperature of 100 K during operation. In this case, the damage caused by the process as described above may increase the occurrence of cracks or fissures in the compound semiconductor.

Some specific embodiments according to the present above aspects will be described below.

A light receiving apparatus according to an embodiment includes: (a) a light receiving device including a compound semiconductor substrate having a principal surface, a plurality of photodiodes each having an electrode, and a plurality of bump electrodes each of which is connected to at least one of the electrodes of the photodiodes, the photodiodes being arranged to form an array on the principal surface of the compound semiconductor substrate; and (b) a semiconductor integrated device including a silicon substrate and a plurality of read-out circuits arranged to form an array on the silicon substrate, each of the read-out circuits having an electrode that is electrically connected to the electrode of the corresponding photodiode in the light receiving device through the bump electrode. The semiconductor integrated device is bonded with the light receiving device so as to face each other in a direction of a first axis through the bump electrodes. The light receiving device has a back surface with a first back edge and a second back edge that extend in a direction of a second axis intersecting with the first axis. The light receiving device has a first slope face extending from the first back edge along a first reference plane, and a second slope face extending from the second back edge along a second reference plane. The back surface of the light receiving device extends along a third reference plane intersecting with the first axis. In addition, the first reference plane and the second reference plane are inclined with the third reference plane.

In the light receiving apparatus, the light receiving device is provided with a first side surface extending from the first back edge along a first reference plane inclined with respect to the third reference plane, and a second side surface extending from the second back edge along the second reference surface inclined with respect to the third reference plane. The first and second side surfaces of the light receiving device are inclined so as to form respective obtuse angles with the back surface, and the obtuse angle inclination can reduce the occurrence of cracking of the light receiving device caused by the cooling of the light receiving apparatus.

In the light receiving apparatus according to an embodiment, preferably, the semiconductor integrated device has a principal surface with a first upper edge and a second upper edge that extend in a direction of the second axis. The semiconductor integrated device has a first slope side extending from the first upper edge along the first reference plane and a second slope side extending from the second upper edge along the second reference plane.

In the light receiving apparatus, the entire first side surface of the light receiving device is definitely inclined with respect to the third reference plane, and the entire second side surface of the light receiving device is definitely inclined with respect to the plane.

In the light receiving apparatus according to an embodiment, preferably, the semiconductor integrated device has a back surface with a first lower edge and a second lower edge that extend in a direction of the second axis. The semiconductor integrated device has a first side face extending from the first lower edge along the first axis and a second side face extending from the second lower edge along the first axis.

The light receiving apparatus can prevent the back surface of the semiconductor integrated device from forming an acute angle with the side surfaces of the semiconductor integrated device at the first lower edge and the second lower edge.

In the light receiving apparatus according to an embodiment, the compound semiconductor substrate may contain gallium as a group III constituent, and antimony as a group V constituent.

In the light receiving apparatus, a compound semiconductor substrate comprising antimony as a group V constituent and the gallium as a group III constituent has a relatively large optical absorption in an infrared wavelength band.

A method for fabricating a light receiving apparatus according to an embodiment includes the steps of: (a) preparing a light receiving device chip including a compound semiconductor substrate with a principal surface, a plurality of photodiodes arrayed on the principal surface of the compound semiconductor substrate, and a plurality of bump electrodes formed on electrodes of the photodiodes, the light receiving device chip having a back surface with a first edge and a second edge; (b) preparing a semiconductor integrated device chip including a silicon substrate with a principal surface, and a plurality of read-out circuits arrayed on the principal surface of the silicon substrate; (c) forming a laminated device by bonding the light receiving device chip with the semiconductor integrated device chip while facing each other in a direction of a first axis through the bump electrodes of the light receiving device chip; and (d) forming a light receiving device having a first side surface and a second side surface by applying a mechanical machining to the first edge and the second edge of the back surface of the light receiving device chip. The light receiving device includes a back surface with a first back edge and a second back edge that extend in a direction of a second axis intersecting with the first axis. The first side surface of the light receiving device extends from the first back edge along a first reference plane. The second side surface of the light receiving device extends from the second back edge along a second reference plane. The back surface of the light receiving device extends along a third reference plane intersecting with the first axis. In addition, the first reference plane and the second reference plane are inclined with the third reference plane.

In the method for fabricating the light receiving apparatus, the substrate product for the light receiving device is subjected to a process for producing the chip in fabricating a light receiving device chip for the light receiving apparatus, thereby forming the light receiving device chip. The light receiving device chip and semiconductor integrated device chip are bonded to produce a laminated device therefrom, and a mechanical processing is applied to the back surface of the light receiving device chip of the laminated device at the first and second edges thereof to form the first and second side surfaces, thereby producing the light receiving device from the light receiving device chip. This processing of the back surface provides the light receiving device with a first side surface extending from the first back edge along the first reference plane that is inclined with respect to the third reference plane, and a second side surface extending from the second back edge along the surface along the second reference plane that is inclined relative to the third reference plane. The light receiving apparatus can reduce the occurrence of cracking caused by cooling.

The method according to an embodiment, may further include the steps of, after forming the laminated device, forming a processed face in the light receiving device chip by applying a mechanical machining to a back surface of the compound semiconductor substrate of the laminated device; and, before forming the light receiving device, forming the back surface of the light receiving device chip by etching the processed face of the light receiving device chip.

In the light receiving apparatus fabricated by the method, the light is made incident on the back surface of the light receiving device to enter the photodiodes through the compound semiconductor substrate. In order to ensure the light receiving, the outer surface of the light receiving device includes the back surface of the light receiving device. The compound semiconductor substrate absorbs a part of the light incident on the back surface of the light receiving device before reaching the photodiodes. The compound semiconductor substrate has a thickness that reduces the optical absorption to a desired level. The compound semiconductor substrate is derived from a support working as a base on which semiconductor layers for the photodiodes are to be grown in a process of fabricating the light receiving device and working as a base supporting the semiconductor layers thus grown. The thickness required for the base supporting the semiconductor layers grown thereon is greater than the thickness that meets the requirement of reducing the optical absorption. The compound semiconductor substrate has a thickness enough to meet the requirement of reducing the optical absorption in the light receiving apparatus. The thinned compound semiconductor substrate alone has smaller mechanical strength as compared with the original support. In the embodiment, after the light receiving device and the semiconductor integrated device are bonded with each other to form a laminated device, the original support in the product thus formed is processed using the semiconductor integrated device as a supporting member, thereby producing the compound semiconductor substrate with a desired thickness. The above processing may include, for example, chemical mechanical polishing, mechanical polishing, and grinding and chemical treatment. Compound semiconductor as machined is easy to break in temperature change, such a, temperature rise or fall of the light receiving apparatus. Specifically, for the thinning, the compound semiconductor is subjected to processing, such as polishing or etching. The application of the present method to the light receiving device chip can provide the light receiving device with first and second side surfaces extending from the first back edge and the second back edge along the first and second reference planes inclined with respect to the third reference plane. The light receiving device with the angle inclination can reduce the occurrence of cracking of the light receiving device caused by the cooling of the light receiving apparatus.

In the method according to an embodiment, in the step of forming the light receiving device by applying the mechanical machining to the back surface of the light receiving device chip, the mechanical machining is preferably applied to the semiconductor integrated device chip so as to produce a semiconductor integrated device from the semiconductor integrated device chip. The semiconductor integrated device has a principal surface with a first upper edge and a second upper edge that extend in a direction of the second axis. In addition, the semiconductor integrated device has a first upper side face extending from the first upper edge along the first reference plane, and a second upper side face extending from the second upper edge along the second reference plane.

In the method of fabricating a light receiving apparatus, the first entire side surface of the light receiving device is definitely inclined with respect to the third reference plane, and the entire second side surface of the light receiving device is definitely inclined with respect to the third reference plane.

Teachings of the present invention can be readily understood by considering the following detailed description with reference to the accompanying drawings shown as examples. Referring to the accompanying drawings, embodiments of a light receiving apparatus, and the method of fabricating a light receiving apparatus according to the present invention will be described. To facilitate understanding, identical reference numerals are used, where possible, to designate identical elements that are common to the figures.

Figure 2:
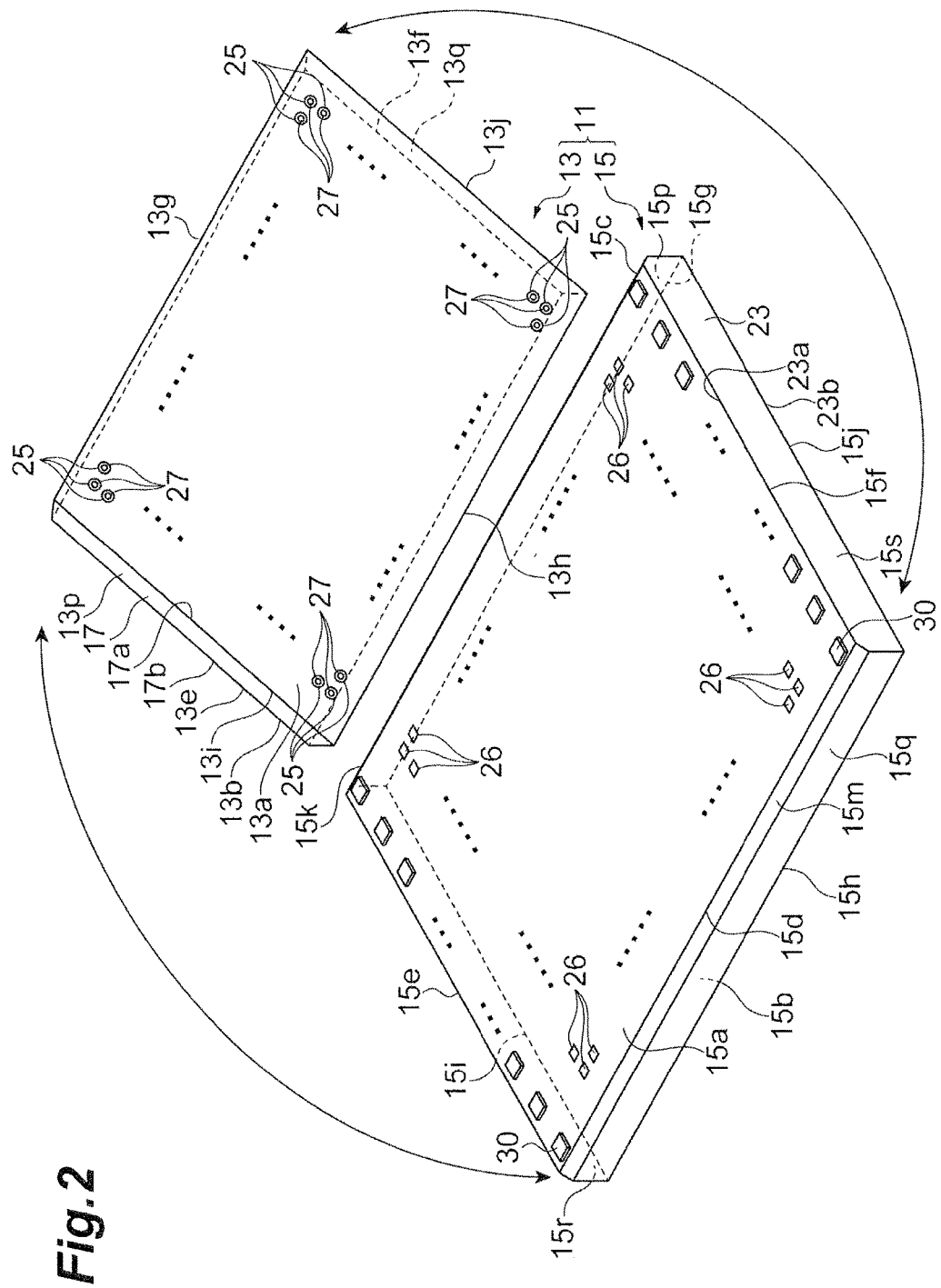
FIG. 2 is a view showing the device surfaces of the light receiving device and semiconductor integrated device that are to be included in the semiconductor light receiving apparatus shown in FIG. 1.

FIG. 1 is a schematic view showing a light receiving apparatus according to the present embodiment. FIG. 2 is a view showing the device surface of the light receiving device and the device surface of the semiconductor integrated device that are included in the light receiving apparatus shown in FIG. 1. The light receiving apparatus 11 according to the present embodiment is sensitive to infrared light. The light receiving apparatus 11 includes a light receiving device 13 and the semiconductor integrated device 15. The light receiving device 13 includes a compound semiconductor substrate 31 having a principal surface 31a and a back surface 31b, and photodiodes 25. The photodiodes 25 are arranged on the principal surface 31a of the compound semiconductor substrate 31 to form an array. The semiconductor integrated device 15 includes a silicon semiconductor substrate 23 having a principal surface 23a and a back surface 23b, and read-out circuits 26 arranged on the silicon semiconductor substrate 23 to form an array. The light receiving device 13 and the semiconductor integrated device 15 are arranged to face each other in the direction of the first axis Ax1 such that the electrodes of the photodiodes 25 are connected through respective bump electrodes 27 with the electrodes of the read-out circuits 26 disposed on the principal surface 23a of the silicon semiconductor substrate 23. The semiconductor integrated device 15 is connected with the light receiving device 13 through the bump electrodes 27. A resin body 29, which is referred to as an underfill, is provided between the semiconductor photodetector 13 and the semiconductor integrated device 15 after being joined together. The resin body 29 may be made of, for example, epoxy or other resin. The light receiving device 13 has a thickness of, for example, 3 to 50 micrometers, and the semiconductor integrated device 15 has a thickness of, for example, 350 to 450 micrometers. The thickness of the light receiving device 13 is smaller than that of the semiconductor integrated device 15. The light receiving device 13 includes a plurality of the photodiodes 25 arrayed on the principal surface 13a. The back surface 13b of the light receiving device 13 has a first back edge 13c, a second back edge 13d, a third back edge 13e and a fourth back edge 13f. In addition, the principal surface 13a of the light receiving device 13 has a first edge 13g, a second edge 13h, a third edge 13i and a fourth edge 13j. The first back edge 13c and the second back edge 13d extend in the direction of the second axis Ax2 intersecting the first axis Ax1, and the third back edge 13e and the fourth back edge 13f extend in the direction of the third axis Ax3 intersecting with the first axis Ax1 and the second axis Ax2. Preferably, the first axis Ax1, the second axis Ax2, and the third axis Ax3 are perpendicular to each other. The light receiving device 13 has a first side surface 13k and a second side surface 13m. The first side surface 13k extends from the first back edge 13c to the first edge 13g along the first reference plane R1EF to form a first slope face. The second side surface 13m extend from the second back edge 13d to the second edge 13h along the second reference plane R2EF to form a second slope face. Specifically, the first side surface 13k is contiguous to the back surface 13b, and the second side surface 13m is contiguous to the back surface 13b. The back surface 13b of the light receiving device 13 extends along the third reference plane R3EF intersecting with the first axis Ax1. The first reference plane R1EF and the second reference plane R2EF are inclined with respect to the third reference plane R3EF. Specifically, the first reference plane R1EF forms a first angle AN1G with the third reference surface R3EF, and the second reference plane R2EF forms a second angle AN2G with the third reference plane R3EF. The first angle AN1G and the second angle AN2G each may be in the range of, for example, 30 to 60 degrees. In the present embodiment, the first and second angles AN1G and AN2G may be, for example, 45 degrees.

The light receiving apparatus 11 provides the light receiving device 13 with the first side surface 13k and the second side surface 13m. The first side surface 13k extends from the first back edge 13c along the first reference plane R1EF inclined to the third reference plane R3EF. The second side surface 13m extends from the second back edge 13d along the second reference plane R2EF inclined to the third reference plane R3EF. The light receiving device 13 thus provided can reduce the occurrence of cracking that may be caused by repeating temperature cycle because the light receiving apparatus 11 is cooled at low temperature during operation. The back surface of the light receiving device 13 is formed by mechanical processing in fabricating the light receiving apparatus 11. The first and second side surfaces 13k and 13m allow the back surface 13b to form respective obtuse angles with the first and second side surfaces 13k and 13m at opposite edges formed in processing the back side surface, thereby blunting the edges.

In the present embodiment, the light receiving device 13 includes a third side surface 13p extending from the third back edge 13e in the direction of the first axis Ax1, and a fourth side surface 13q extending from the fourth back edge 13f in the direction of the first axis Ax1. The third and fourth side surfaces 13p and 13q of the light receiving device 13 each include no inclined surface like the first and second side surfaces 13k and 13m. The third side surface 13p is contiguous to the first side surface 13k and the second side surface 13m, and the fourth side surface 13q is contiguous to the first side surface 13k and the second side surface 13m. The third side surface 13p and the fourth side surface 13q are contiguous to the principal surface 13a and the back surface 13b. The back surface 13b of the light receiving device 13 is formed to have a substantially quadrilateral, and the principal surface 13a of the light receiving device 13 is also formed to have a substantial quadrilateral. The width of the back surface 13b of the light receiving device 13 has a width less than that of the principal surface 13a of the light receiving device 13 in the direction of the third axis Ax3. The arrayed photodiodes 25 are disposed on the principal surface 13a of the light receiving device 13 within the width of the back surface 13b of the light receiving device 13. The back surface 13b of the light receiving device 13 is irradiated with light to be detected, and the light is incident on the arrayed photodiodes 25 from the back surface 13b without interference from the first and second side surface 13k and 13m of the light receiving device 13.

Specifically, the resin material 29 is filled between the light receiving device 13 and the semiconductor integrated device 15 that have been assembled together. The resin body 29 also includes a first resin surface 29a extending along the first reference plane R1EF in alignment with the first side surface 13k, and a second resin surface 29b extending along the second reference plane R2EF in alignment with the second side surface 13m.

The semiconductor integrated device 15 includes a principal surface 15a, and a back surface 15b opposite to the principal surface 15a. The read-out circuits 26 are arranged on the principal surface 15a of the semiconductor integrated device 15 (e.g. the principal surface 23a). The principal surface 15a of the semiconductor integrated device 15 has a first upper edge 15c, a second upper edge 15d, a third upper edge 15e and a fourth upper edge 15f. The first upper edge 15c and the second upper edge 15d extend in the direction of the second axis Ax2, and the third upper edge 15e and the fourth upper edge 15f extend in the direction of the third axis Ax3.

The semiconductor integrated device 15 has a first slope side 15k extending from the first upper edge 15c along the first reference plane R1EF, and a second slope side 15m extending from the second upper edge 15d along the second reference plane R2EF. This semiconductor integrated device 15 in the light receiving apparatus 11 ensures that the whole of the first side surface 13k of the light receiving device 13 is inclined with respect to the first reference plane R1EF and that the whole of the second side surface 13m of the light receiving device 13 is inclined with respect to the second reference plane R2EF. The first and second side surfaces 13k and 13m form respective acute angles with the principal surface 13a of the light receiving device 13 at the peripheral edge with the acute angles, and the first slope side face 15k and the second slope side 15m of the semiconductor integrated device 15 prevent the peripheral edge from projecting outside the semiconductor integrated device 15. The back surface 15b of the semiconductor integrated device 15 has a first lower edge 15g, a second lower edge 15h, a third lower edge 15i and a fourth lower edge 15j. The first lower edge 15g and the second lower edge 15h extend in the direction of the second axis Ax2, and the third lower edge 15i and the fourth lower edge 15j extend in the direction of the third axis Ax3.

The semiconductor integrated device 15 includes a first side face 15p extending from the first lower edge 15g in the direction of the first axis Ax1, and a second side face 15q extending from the second lower edge 15h in the direction of the first axis Ax1. In the present embodiment, the first slope side 15k and the second slope side 15m are contiguous to the first side face 15p and the second side face 15q so as to form respective obtuse angles, respectively. The first side face 15p and the second side face 15q extending in the direction of the axis Ax1 can prevent the back surface 15b of the semiconductor integrated device 15 from forming acute angles with the first slope side 15k and the second slope side 15m at the first lower edge 15g and the second lower edge 15h.

In the present embodiment, the light receiving device 13 includes a third side surface 13p extending from the third back edge 13e to the third edge 13i in the direction of the first axis Ax1, and a fourth side surface 13q extending from the fourth back edge 13f to the fourth edge 13j in the direction of the first axis Ax1.

In addition, the semiconductor integrated device 15 includes a third side face 15r extending from the third lower edge 15i to the third upper edge 15e in the direction of the first axis Ax1, and a fourth side face 15s extending from the fourth lower edge 15j to the fourth upper edge 15f in the direction of the first axis Ax1.

The semiconductor integrated device 15 includes pad electrodes 30 arranged along each of a third upper edge 15e and a 34th edge 15f. The pad electrodes 30 are used to make an electrical connection for receiving electrical signals out of the light receiving apparatus 11. The read-out circuits 26 of the semiconductor integrated device 15 are connected to the pad electrodes 30. In the light receiving apparatus 11, the photodiodes 25 convert light incident on the back surface 13b of the light receiving device 13 into respective electrical signals. These electrical signals are sent to the respective read-out circuits 26 of the semiconductor integrated device 15 through the bump electrodes 27 on the photodiodes 25. The read-out circuits 26 process the electrical signals thus received.

FIGS. 3A and 3B show the light receiving device and the bump electrodes thereon. FIG. 3A shows a cross section taken along a line extending parallel to the third axis Ax3. FIG. 3B shows a cross section taken along a line extending parallel to the second axis Ax2. The photodiodes 25 are two-dimensionally arranged on the principal surface 31a of the compound semiconductor substrate 31. The compound semiconductor substrate 31 contains gallium (Ga) as a group III constituent and antimony (Sb) as a group V constituent. For example, the compound semiconductor substrate 31 is made of GaSb. The photodiodes 25 include semiconductor mesas, which are separated from each other by grooves defining the semiconductor mesa. Each photodiode 25 includes a first conductive type compound semiconductor layer 33, a superlattice layer 35 made of a compound semiconductor, and a second conductive type compound semiconductor layer 37. The first conductive type compound semiconductor layer 33, the superlattice layer 35 and the second conductive type compound semiconductor layer 37 are arranged in order on a principal surface 31a of the compound semiconductor substrate 31. The first conductivity type compound semiconductor layer 33 is provided so as to be common to the photodiodes 25. The semiconductor surfaces of the photodiodes 25 are covered with a passivation film 39. The passivation film 39 has a first opening 39a located on the upper surface of the semiconductor mesa of each photodiode 25, and a second opening 39b located on the first conductive type semiconductor layer 33 common to the photodiodes 25. The first electrode 41a forms a contact with the upper surface of the second conductive type semiconductor layer 37 in the semiconductor mesa through the first opening 39a. The second electrode 41b forms a contact with the upper surface of the first conductive type semiconductor layer 33 through the second opening 39b, and extends on the passivation film 39 covering the side of the semiconductor mesa to reach the upper surface of the semiconductor mesa. The bump electrodes 27 are disposed on the first and second electrodes 41a and 41b. The photodiodes 25 may include an anti-reflection film 43 disposed on the back surface 31b of the compound semiconductor substrate 31. The photodiodes 25 receive light through the anti-reflection film 43.

In the present embodiment, the light receiving device 13 has respective inclined surfaces, which are inclined with respect to the back surface 13b, at the third back edge 13e and 14 the edge 13f of the back surface 13b. The inclined surfaces are provided with a (111)B plane of GaSb, which is an orientation having a large etching rate in wet etching process. The inclined surfaces are contiguous to the third side surface 13p and the fourth side surface 13q. By using a wet etching method for etching the back surface 13b, the inclined surfaces at the third back edge 13e and the fourth back edges 13f are formed, simultaneously. In addition to these inclined surfaces, as already described above, the light receiving device 13 includes the first side surface 13k that extends from the first back edge 13c to the first edge 13g, and the second side surface 13m that extends from the second back edge 13d to the second edge 13h. Each of the first and second side surfaces 13k and 13m (slope surfaces) are inclined relative to the back surface 13b. The above inclined surfaces which are disposed so as to be inclined with respect to the back side 13b at the third back edge 13e and fourth back edge 13f, have widths which are smaller than the width of the inclined surface extending from the first back edge 13c to the first edge 13g (the first side surface 13k) and which are smaller than the width of the inclined surface extending from the second back edge 13d to the second edge 13h (the second side surface 13m). In the present embodiment, the light receiving device 13 has the back surface 13b of the four sides contiguous to the inclined surfaces that can reduce the possibility of damage to the light receiving device 13.

Subsequently, explanation for a method of fabricating a light receiving apparatus 11 will be given below. In order to facilitate understanding, where possible, the reference numerals shown in FIGS. 1 to 3 will be used in the subsequent description.

Figure 5:
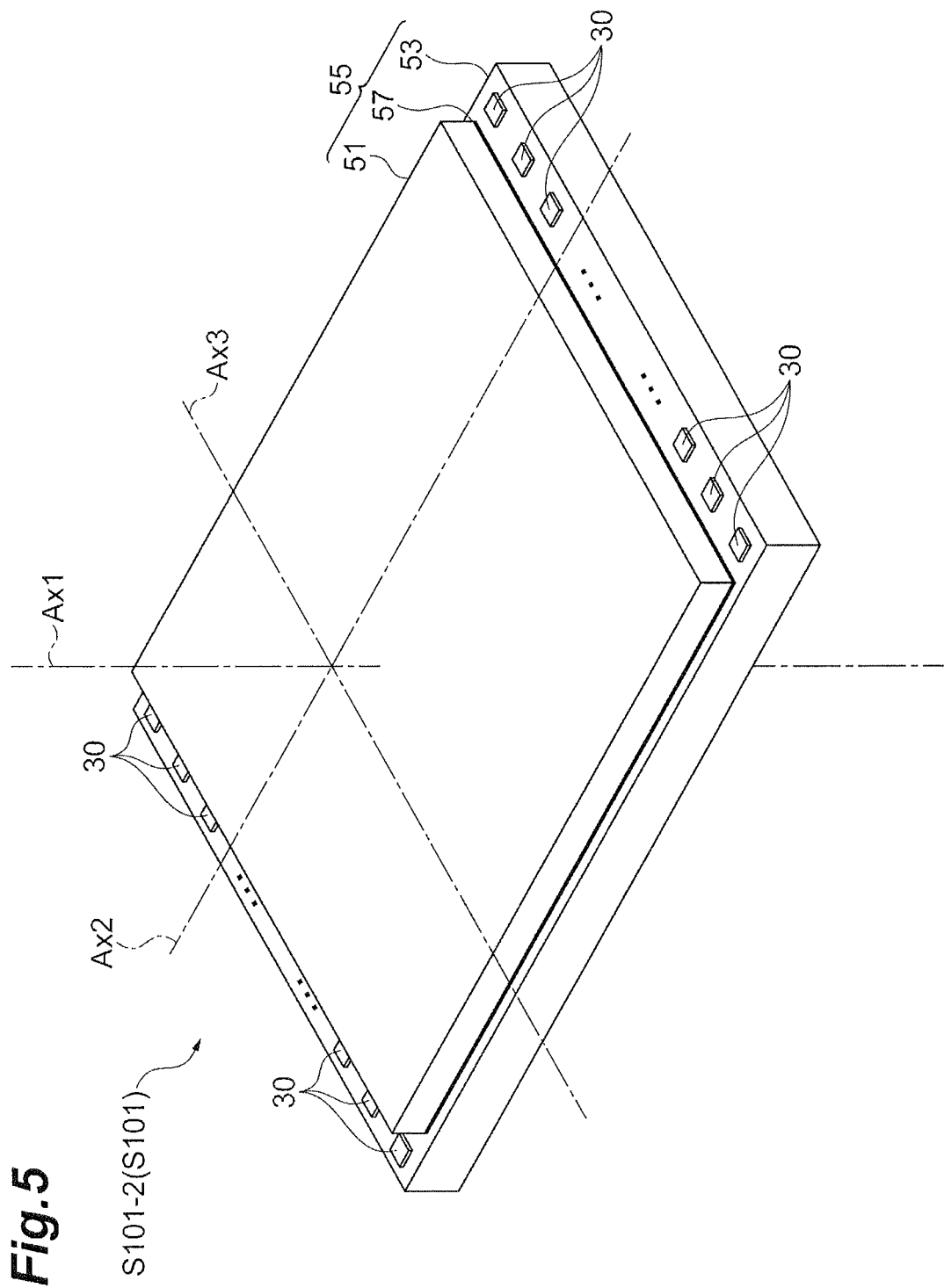
FIG. 5 is a schematic view showing a product in a major step in the method of fabricating a light receiving apparatus according to the present embodiment.
Figure 6:
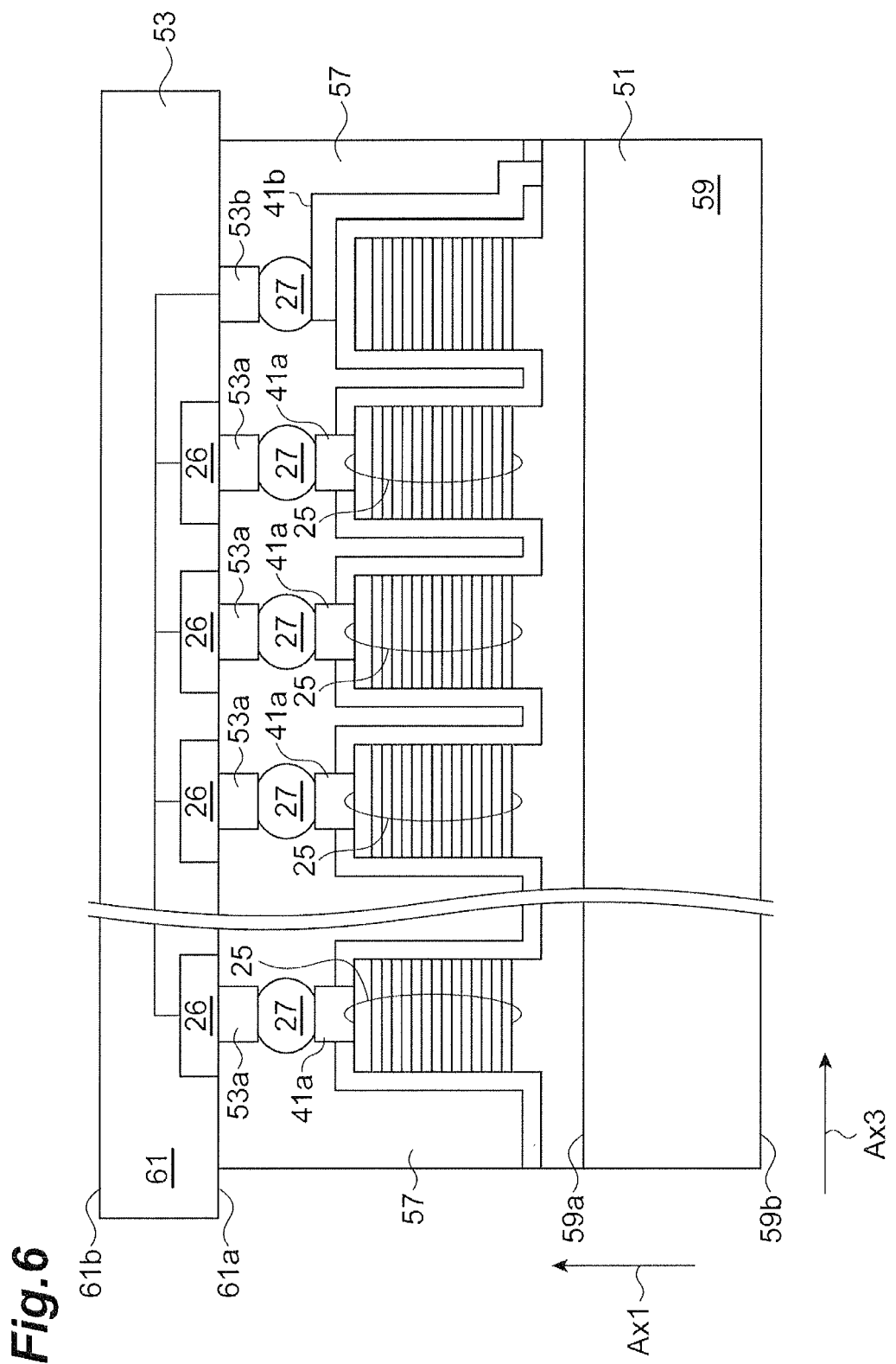
FIG. 6 is a schematic view showing a product in a major step in the method of fabricating a light receiving apparatus according to the present embodiment.

In step S101, a laminated device 55 is prepared, and the laminated device 55 includes the light receiving device chip 51 and the semiconductor integrated device chip 53. In step S101-1, as shown in FIG. 4, a light receiving device chip 51 and the semiconductor integrated device chip 53 are prepared. The principal surface 51a of the light receiving device chip 51 includes the arrayed photodiodes 25, similarly to the principal surface 13a of the light receiving device 13. The photodiodes 25 include respective electrodes 27 thereon. The semiconductor integrated device chip 53 is called as the read-out integrated circuit (ROIC). In step S101-2, as shown in FIG. 5, the laminated device 55 is prepared. The laminated device 55 includes the light receiving device chip 51 and the semiconductor integrated device chips 53, which are arranged to face each other in the direction of the first axis Ax1. The bump electrodes 27, which are arranged between the light receiving device chip 51 and the semiconductor integrated device chips 53, electrically connect the chips by bonding. The bump electrodes 27 are used for an electrical connection and mechanical bonding. Resin 57 is filled between the light receiving device chip 51 and the semiconductor integrated device chip 53, and acts as an underfill. FIG. 6 is a schematic cross sectional view, taken along a line parallel to a plane defined by the first axis Ax1 and the third axis Ax3, showing the laminated device 55. The light receiving device chip 51 includes a compound semiconductor substrate 59 having a principal surface 59a and a back surface 59b, and the photodiodes 25 arranged to form an array on the principal surface 59a of the compound semiconductor substrate 59. The semiconductor integrated device chip 53 includes a silicon semiconductor substrate 61 having a principal surface 61a and a back surface 61b, and read-out circuits 26 arranged on the silicon semiconductor substrate 61 to form an array, and are joined through the bump electrodes 27 to the light receiving device chip 51.

A concise explanation will be given of the fabrication of a light receiving device chip 51.

A semiconductor laminate for the photodiode 25 is grown on a compound semiconductor wafer with a thickness of 200 to 650 micrometers to produce an epitaxial wafer. The epitaxial wafer is processed to form a product including arrayed semiconductor mesas for the photodiodes used as optical sensors, and a passivation film 39. The first electrodes 41a and the second electrodes 41b are formed thereon to fabricate the substrate product. The substrate product thus formed is processed with a dicing saw to produce the light receiving device chip 51, such as a sensor chip. The sensor chip includes, for example, an array of 320×256 pixels, each of which includes the photodiode.

The first electrodes 41a and the second electrodes 41b of the light receiving device chip 51 are connected through the bump electrodes 27 to the third electrodes 53a and the fourth electrodes 53b of the semiconductor integrated device chip 53, respectively. The third electrodes 53a of the semiconductor integrated device chip 53 are formed on the corresponding read-out circuits 26.

Figure 7:
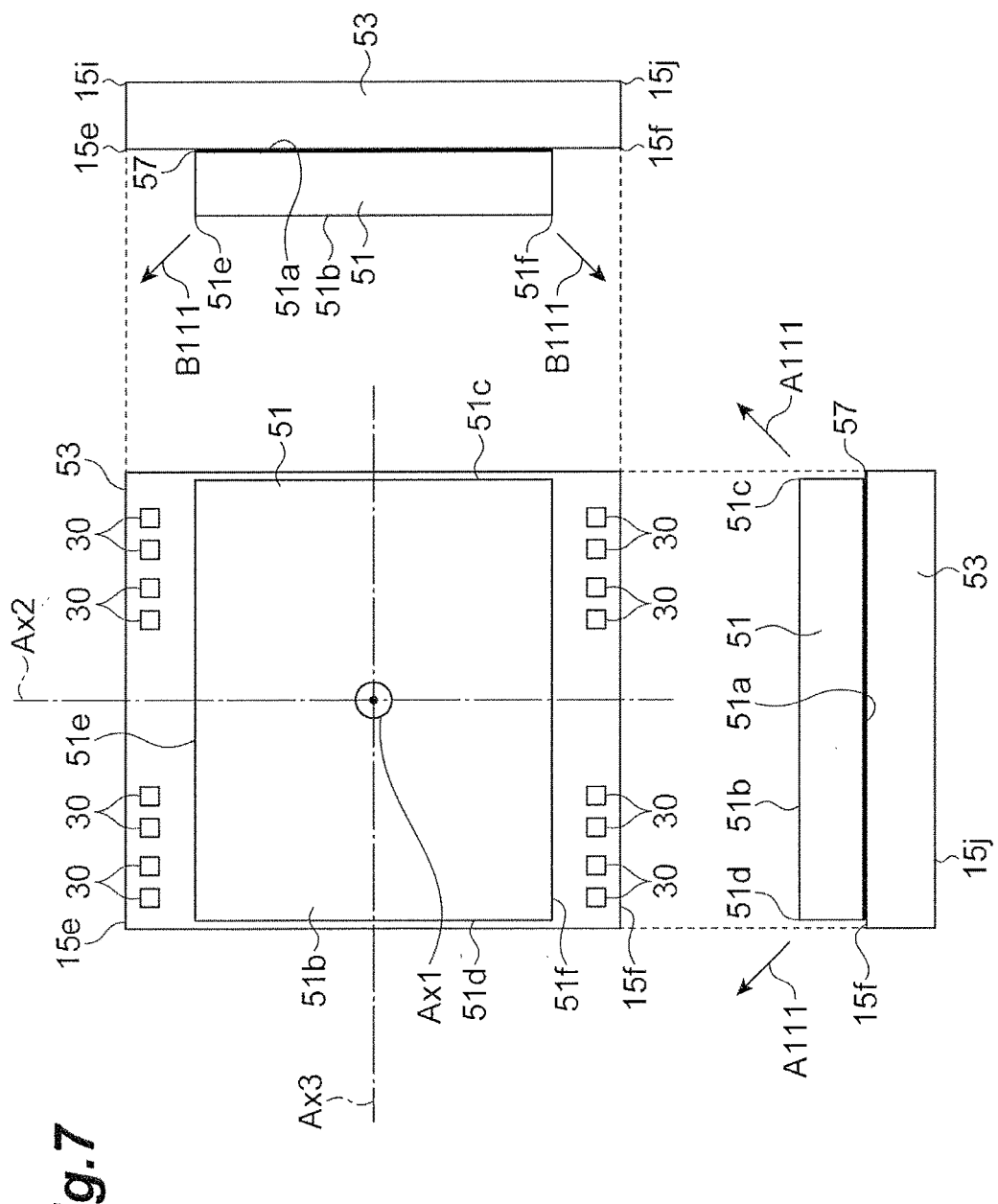
FIG. 7 is a schematic view showing a product in a major step in the method of fabricating a light receiving apparatus according to the present embodiment.

Upon joining, light receiving device chip 51 is oriented to the semiconductor integrated device chip 53. In the laminated device 55, as shown in FIG. 7, the edges 51c and 51d of the back surface 51b (opposite to the principal surface 51a) of the light receiving device chips 51 extend in the direction of the second axis Ax2. At the edges 51c and 51d, a plane (111)A of the compound semiconductor substrate 31 is oriented in the direction of the arrow A111. The edges 51e and 51f of the back surface 51b of the light receiving device chip 51 extend in the direction of the third axis Ax3, and at the edges 51e and 51f, a (111)B plane of the compound semiconductor substrate 31 is oriented in the direction of the arrow B111. In the semiconductor integrated device chip 53, the pad electrodes 30 are arranged along the edges (15e, 15f) extending in the direction of the third axis Ax3.

Figure 8:
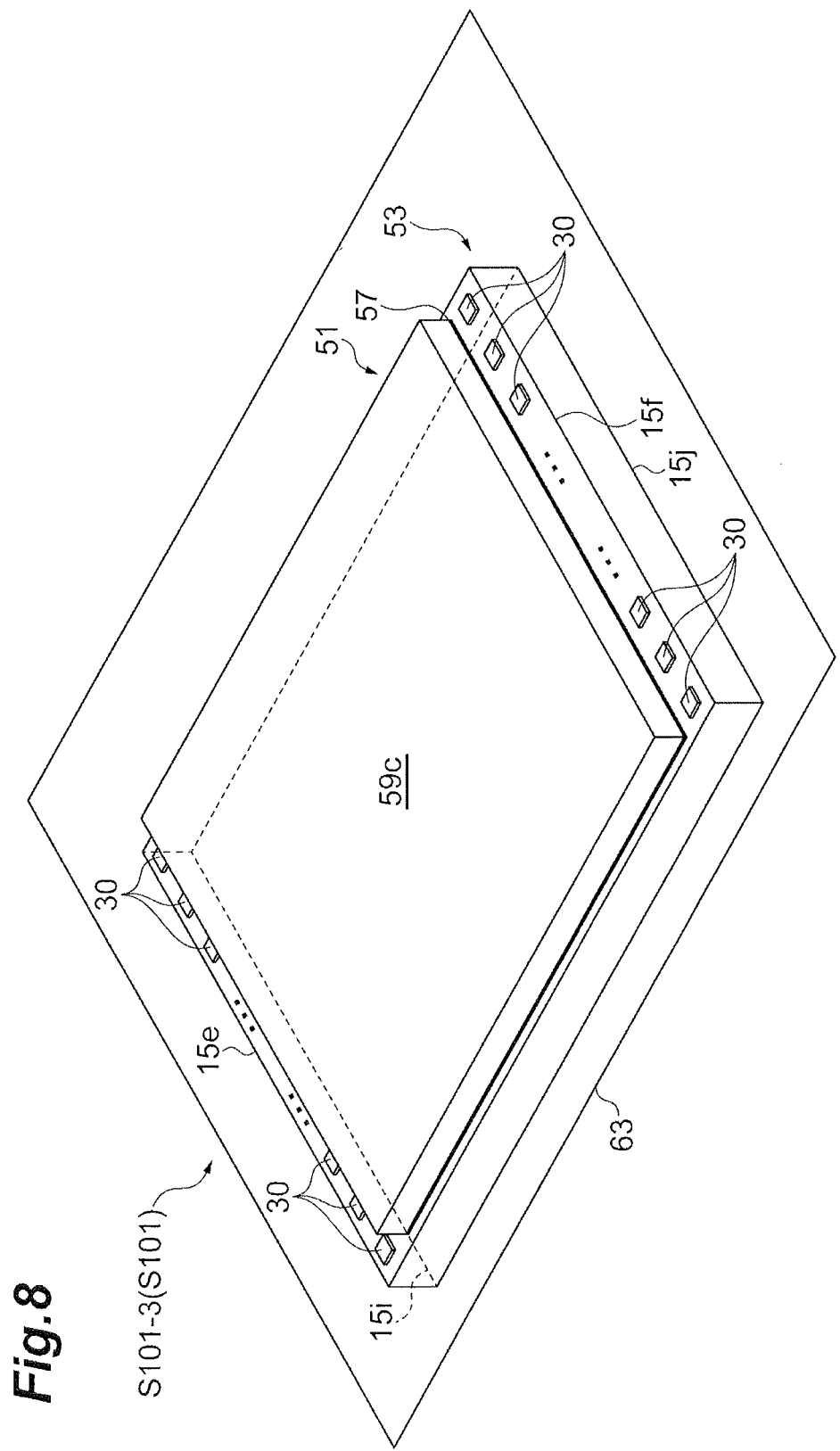
FIG. 8 is a schematic view showing a product in a major step in a method of fabricating a light receiving apparatus according to the present embodiment.

In step S101-3, the laminated device 55 is attached to the support, and, as shown in FIG. 8, a mechanical processing is applied to the back surface 59b of the compound semiconductor substrate 59 in the laminated device 55 using the processing unit 63 to form a processed surface 59c (newly formed back) in the light receiving device chip 51. The mechanical processing is performed, for example, by mechanical polishing, chemical mechanical polishing and/or other processing. The compound semiconductor substrate 59 thus processed has a thickness of, for example, about 10 to 70 micrometers.

Figure 9:
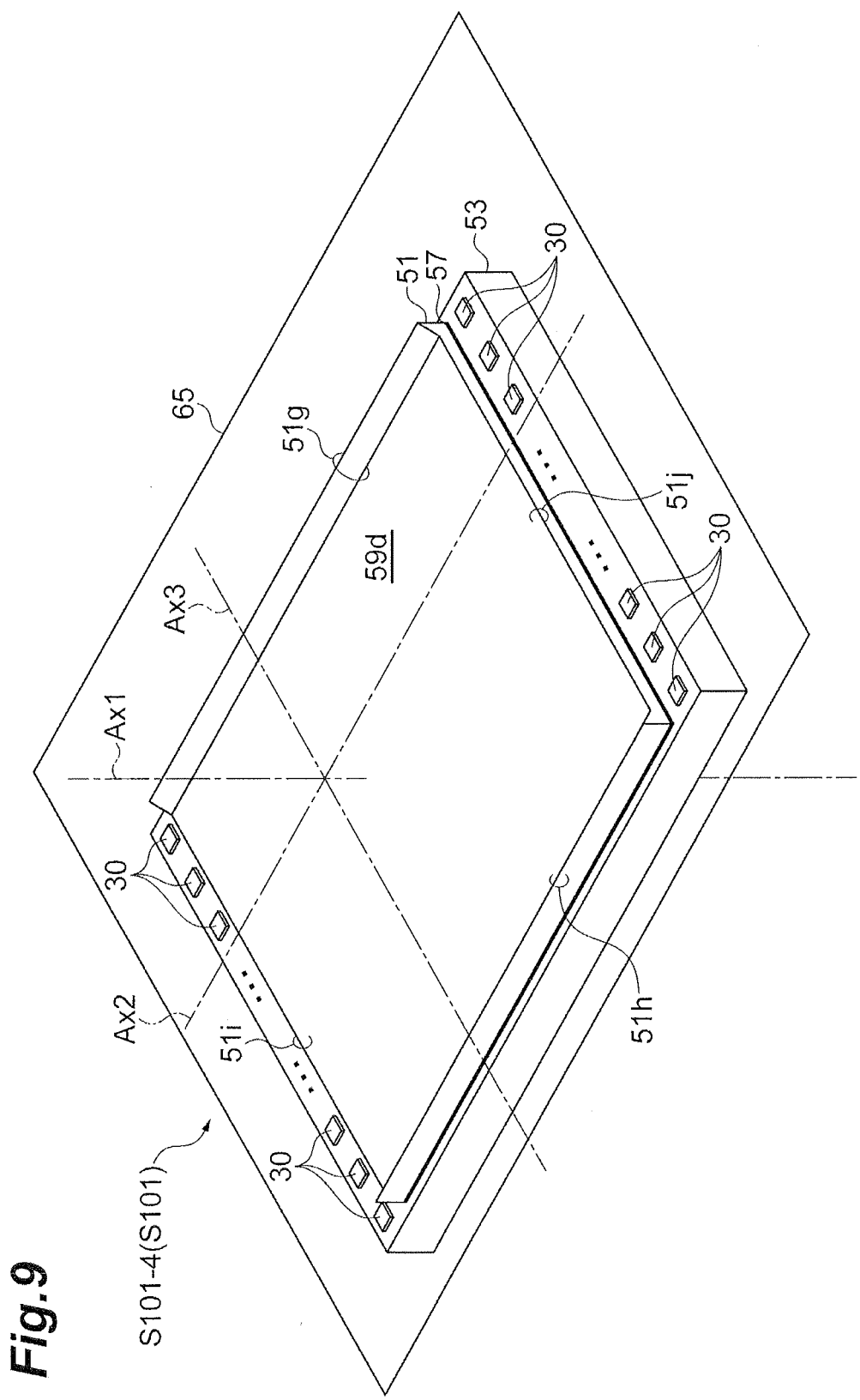
FIG. 9 is a schematic view showing a product in a major step in a method of fabricating a light receiving apparatus according to the present embodiment.

After the mechanical processing, in step S101-3, as shown in FIG. 9, etching the processed surface 59c of the light receiving device chip 51 by using the etching apparatus 65 provides an etched surface 59d working as the back surface (new back surface) in the light receiving device chip 51. Etchant for wet etching may include phosphoric acid, a mixed solution of hydrochloric acid and hydrogen peroxide, a mixed solution of phosphoric acid, hydrogen peroxide and citric acid, or other material. The compound semiconductor substrate 59 with the surface 59d thus wet-etched has a thickness of, for example, 50 micrometers or less. In the present embodiment, the resultant compound semiconductor substrate 59 has a thickness of, for example about 20 micrometers.

In etching a semiconductor by using wet etching, the semiconductor may be etched anisotropically. Generally, the etching rate of the (111)B plane of the semiconductor crystal is greater than that of a (100) plane, and the etching rate of the (111)A plane is smaller than that of a (100) plane. The wet etching with the above anisotropy provides the four edges of the etched surface 59d with characteristic shapes associated with the etching rates. Specifically, as shown in FIG. 9, the edges 51g and 51h of the etched surface 59d of the light receiving device chips 51 extend in the direction of the second axis Ax2, and the edges 51g and 51h of the compound semiconductor substrate 31, which are formed because of the etching anisotropy of the (111)A plane of the compound semiconductor substrate 31, have respective wedge-shaped walls that protrude in the direction of the first axis Ax1. The slope of the wedge-shaped wall is provided with a (111)A plane exhibiting a slow etch-rate. In contrast, the edge parts 51i and 51j of the etched surface 59d of the back surface 51b of the light receiving device chip 51 extend in the direction of the third axis Ax3, and the edge parts 51i and 51j, which are formed because of the etching anisotropy of the (111)B plane, have respective slopes with a (111)B of the compound semiconductor substrate 31 plane exhibiting a fast etch rate. The wall height of the edge parts 51g and 51h and the slope width of the edge parts 51i and 51j depend upon a thickness of the semiconductor to be processed by wet etching. Typically, an amount of wet etching is 5 to 20 micrometers, for example.

Figure 10:
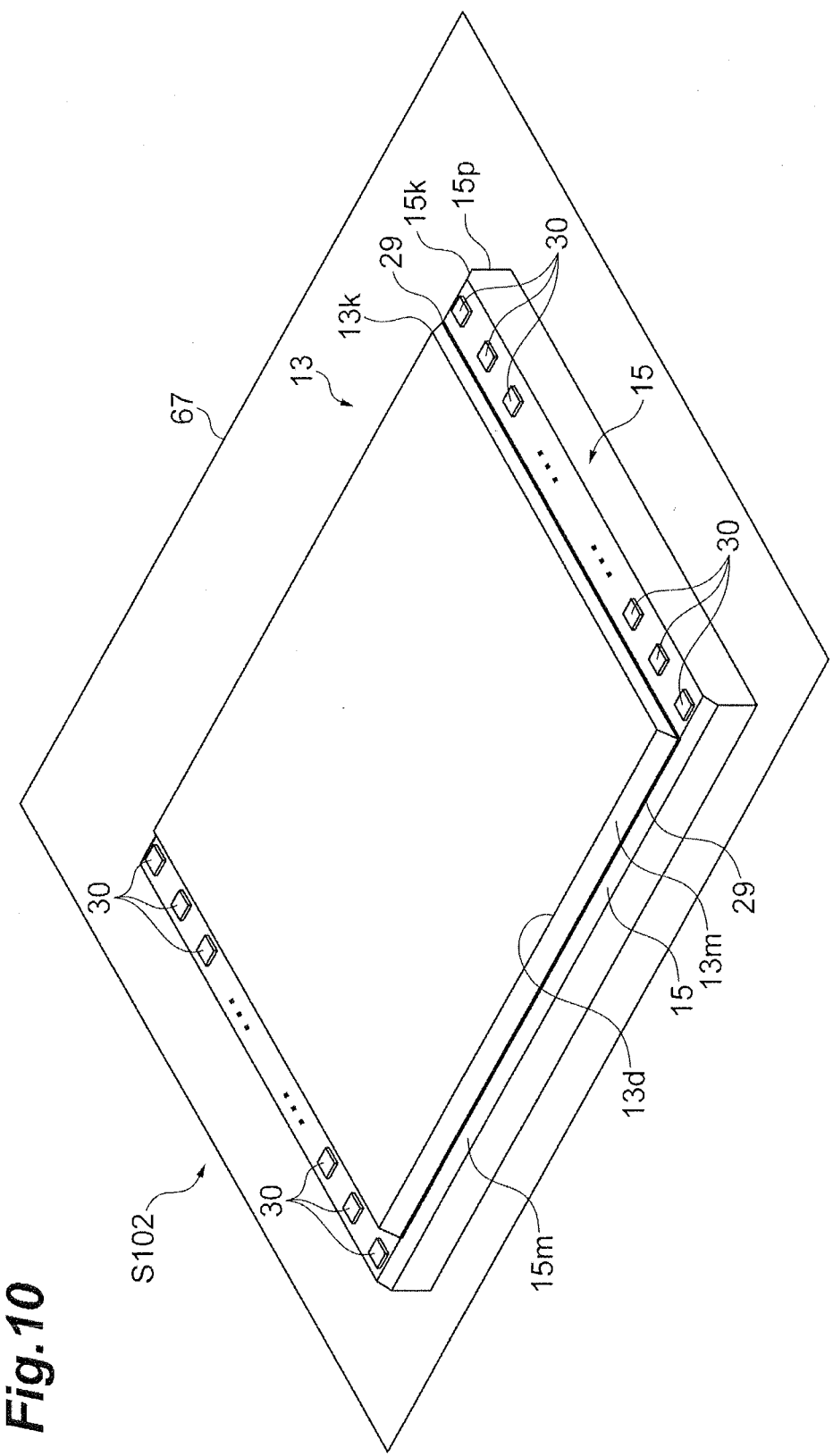
FIG. 10 is a schematic view showing a product formed in the major step of the method of fabricating a light receiving apparatus according to the present embodiment.

In step S102, the edge parts 51g and 51h of the back surface (the etched surface 59d) of the light receiving device chip 51 of the laminated device 55 are mechanically processed. As shown in FIG. 10, a light receiving device 13 having a first side surface 13k and a second side surface 13m is formed from the light receiving device chip 51. The application of the mechanical processing forms the light receiving apparatus 11, as shown in FIG. 1.

Figure 11C:
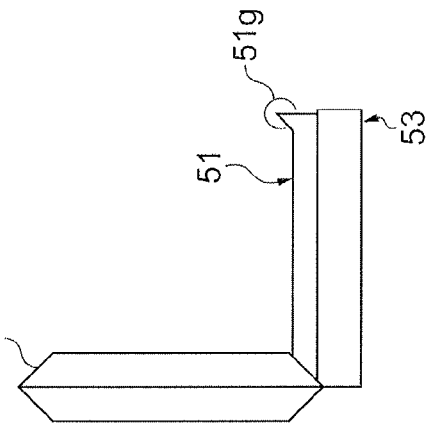
FIG. 11C is a view showing a major step in the method of fabricating a light receiving apparatus according to the present embodiment.
Figure 11D:
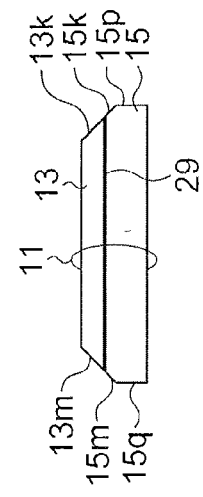
FIG. 11D is a product in a major step in the method of fabricating a light receiving apparatus according to the present embodiment.
Figure 11A:
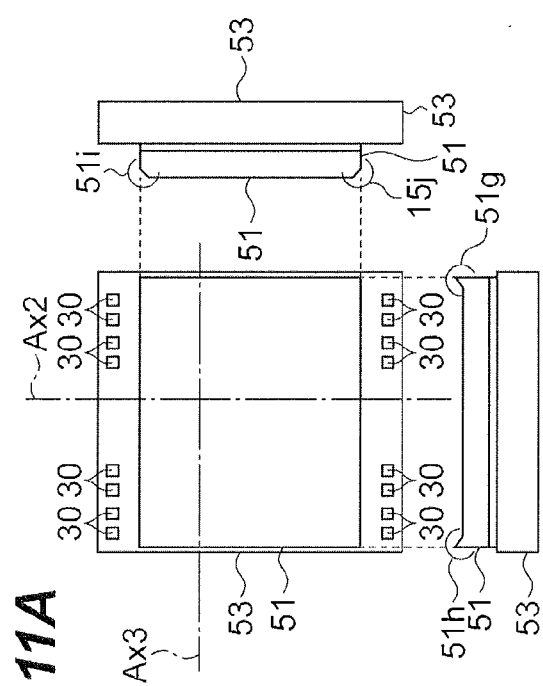
FIG. 11A is a view showing a major step in the method of fabricating a light receiving apparatus according to the present embodiment.
Figure 11B:
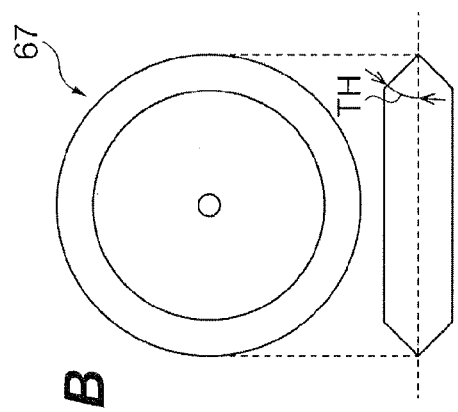
FIG. 11B is a view showing a machining tool used in the method of fabricating a light receiving apparatus according to the present embodiment.

FIGS. 11A, 11B, 11C and 11D are views showing the step S102 in detail. FIG. 11A is a drawing showing the upper and side surfaces of the laminated device 55 to be processed in step S102 by the machining tool 67 shown in FIG. 11B, after the wet etching. The processing tool 67 is used to remove the walls at the edge parts 51h and 51g of the laminated device 55 which has been wet etched. The wall of the edge part 51h of the light receiving device chip 51, as shown in FIG. 11C, is removed by processing both of the light receiving device chip 51 and the semiconductor integrated device chip 53. Similarly, the wall of the edge part 51g of the light receiving device chip 51 is removed by the processing both of the light receiving device chip 51 and the semiconductor integrated device chip 53 to obtain the light receiving apparatus 11, as shown in FIG. 11D. The processing tool 67 may be, for example, a disk-shaped grinding tool. The walls of the edge parts 51g and 51h of the light receiving device chip 51 are polished by the rotation of the disk-shaped grinding tool to form polishing surfaces having an inclined plane therein. The polishing face of the machining tool 67 has an inclination angle TH of, for example, 45 degrees.

In the method of producing the light receiving apparatus 11 which includes fabricating the light receiving device chip 51, the processes of fabricating the chips and/or thinning the compound semiconductor substrate 59 are performed to form the light receiving device chip 51 for the light receiving apparatus 11. The laminated device 55 is produced from the light receiving device chip 51 thus fabricated and the semiconductor integrated device chip 53. In addition, edges 51g and 51h of the back surface of the light receiving device chip 51 in the laminated device 55 are mechanically processed to produce a light receiving device 13 which has the first and second side surface 13k and 13m from the light receiving device chip 51. The above processing of the light receiving device chip 51 provides the light receiving device 13 having the first side surface 13k extending from the first back edge 13c along the first reference surface R1EF inclined with respect to the third reference plane R3EF, and the second side surface 13m extending from the second back edge 13d along the second reference plane R2EF inclined with respect to the third reference surface R3EF. The light receiving apparatus 11 thus formed can reduce the occurrence of cracking because of repeating temperature cycle of temperature rise and fall for operating the light receiving apparatus 11.

Light is incident on the light receiving apparatus 11 through the back surface of the light receiving device 13, and the incident light propagates through the compound semiconductor substrate 31 to reach the photodiodes 25. For the purpose of the light reception, the back surface of the light receiving device 13 appears on the outer surface of the light receiving apparatus 11. A part of the light incident on the back surface of the light receiving device 13 may be absorbed by the compound semiconductor substrate 31, and the remaining light reaches the photodiodes 25. In order to reduce the optical absorption in the compound semiconductor substrate 31, the thickness of the compound semiconductor substrate 31 is reduced. The compound semiconductor substrate 31 is derived from a support working as a base on which semiconductor layers (33, 35, and 37) for the photodiodes (25) are to be grown and working as a base supporting the semiconductor layers (33, 35, and 37) thus grown in a fabricating process of the light receiving device. The thickness required for the base supporting the semiconductor layers grown thereon is greater than the thickness that meets the demand of reducing the optical absorption. The compound semiconductor substrate 31 has a thickness enough to meet the requirements of reducing the optical absorption in the light receiving apparatus 11. The thinned compound semiconductor substrate 31 alone has smaller mechanical strength as compared with the original support having the thickness of 200 to 650 micrometers. In the embodiment, after the light receiving device 13 and the semiconductor integrated device 15 are bonded with each other to form a laminated device, the original support in the product thus formed is processed using the semiconductor integrated device 15 as a supporting member, thereby producing the compound semiconductor substrate 31 with a desired thickness of, for example, 50 micrometers or less to reduce the optical absorption. The above processing may include, for example, chemical mechanical polishing (CMP), mechanical polishing and grinding and chemical treatment. In the embodiment, the light receiving apparatus 11 is needed to be cooled at low temperature during operation. In cooling the light receiving apparatus 11, distortion caused by difference in thermal expansion coefficient between the light receiving device 13 on the compound semiconductor substrate 31 and the semiconductor integrated device 15 on the silicon semiconductor substrate 23 produces thermal stress in the light receiving apparatus 11. A compound semiconductor is easy to break as compared with a silicon semiconductor. Therefore, the compound semiconductor substrate 31 and the light receiving device 13 grown thereon that are made of a compound semiconductor are easily broken with cracking by the thermal stress in the light receiving apparatus 11 in the repeat of the temperature cycle. The light receiving device 13 is provided with the first side surface 13k and the second side surface 13m. The light receiving device with the inclined side surfaces can reduce the occurrence of cracking in the light receiving device caused by the cooling of the light receiving apparatus 11.

After processing the laminated device 55 to produce the light receiving apparatus 11 in step S102, in the process by which the step S102 is followed, the receiving apparatus is die bonded to a package, and the pad electrodes 30 of the semiconductor integrated device 15 of the light receiving apparatus 11 are connected to the electrodes of the package by wire bonding.

Example

The following two devices are prepared: a device which has been subjected to the process in the step S101 (the light receiving apparatus with walls in the edges 51g and 51h); and a device which has been subjected to the process in the steps S101 and S102 (light receiving apparatus with the first and second side surfaces 13k and 13m). The semiconductor integrated device 15 in the light receiving apparatus 11 may include a silicon integrated circuit in which the silicon substrate has a thickness of 400 micrometers.

Structure of the Device which has been Subjected to the Process in the Step S101.

The compound semiconductor substrate of the light receiving device in the laminated device is a gallium antimony (GaSb) substrate, and the light receiving device including walls at the edges 51g and 51h of the back surface thereof has a thickness of 25 to 30 micrometers.

Structure of the Device which has been Subjected to the Process in the Steps S101 and S102.

A compound semiconductor substrate of the light receiving device in the laminated device according to the present embodiment is a gallium antimony (GaSb) substrate, and the light receiving device having a substantially flat back surface has a thickness of 20 to 25 micrometers.

These light receiving apparatuses are cooled together from room temperature to a cooling temperature, for example 77 Kelvin, and the temperature of the light receiving apparatuses is returned together from the cooling temperature 77 Kelvin to room temperature. The light receiving device in the light receiving apparatus having walls at the edges 51g and 51h of the back surface thereof has cracked. The light receiving device in the light receiving apparatus having the first and second side surface 13k and 13m is not cracked.

Having described and illustrated the principle of the invention in a preferred embodiment thereof, it is appreciated by those having skill in the art that the invention can be modified in arrangement and detail without departing from such principles. We therefore claim all modifications and variations coming within the spirit and scope of the following claims.

What is claimed is:

1. A light receiving apparatus comprising:
   a light receiving device including a compound semiconductor substrate having a principal surface, a plurality of photodiodes each having an electrode, and a plurality of bump electrodes each of which is connected to at least one of the electrodes of the photodiodes, the photodiodes being arranged to form an array on the principal surface of the compound semiconductor substrate; and
   a semiconductor integrated device including a silicon substrate and a plurality of read-out circuits arranged to form an array on the silicon substrate, each of the read-out circuits having an electrode that is electrically connected to the electrode of a corresponding photodiode in the light receiving device through the bump electrodes,
   wherein the semiconductor integrated device is bonded with the light receiving device so as to face each other in a direction of a first axis through the bump electrodes,
   the light receiving device has a back surface with a first back edge and a second back edge that extend in a direction of a second axis intersecting with the first axis,
   the light receiving device has a first slope face extending from the first back edge along a first reference plane, and a second slope face extending from the second back edge along a second reference plane,
   the back surface of the light receiving device extends along a third reference plane intersecting with the first axis, and
   the first reference plane and the second reference plane are inclined with the third reference plane.

2. The light receiving apparatus according to claim 1, wherein the semiconductor integrated device has a principal surface with a first upper edge and a second upper edge that extend in a direction of the second axis, and
   the semiconductor integrated device has a first slope side extending from the first upper edge along the first reference plane and a second slope side extending from the second upper edge along the second reference plane.

3. The light receiving apparatus according to claim 2,
   wherein the semiconductor integrated device has a back surface with a first lower edge and a second lower edge that extend in a direction of the second axis, and
   the semiconductor integrated device has a first side face extending from the first lower edge along the first axis and a second side face extending from the second lower edge along the first axis.

4. The light receiving apparatus according to claim 1,
   wherein the semiconductor integrated device has a back surface with a first lower edge and a second lower edge that extend in a direction of the second axis, and
   the semiconductor integrated device has a first side face extending from the first lower edge along the first axis and a second side face extending from the second lower edge along the first axis.

5. The light receiving apparatus according to claim 1, wherein the compound semiconductor substrate contains gallium as a group III constituent, and antimony as a group V constituent.

6. A method for fabricating a light receiving apparatus, the method comprising the steps of:
   preparing a light receiving device chip including a compound semiconductor substrate with a principal surface, a plurality of photodiodes arrayed on the principal surface of the compound semiconductor substrate, and a plurality of bump electrodes formed on electrodes of the photodiodes, the light receiving device chip having a back surface with a first edge and a second edge;
   preparing a semiconductor integrated device chip including a silicon substrate with a principal surface, and a plurality of read-out circuits arrayed on the principal surface of the silicon substrate;
   forming a laminated device by bonding the light receiving device chip with the semiconductor integrated device chip while facing each other in a direction of a first axis through the bump electrodes of the light receiving device chip; and
   forming a light receiving device having a first side surface and a second side surface by applying a mechanical machining to the first edge and the second edge of the back surface of the light receiving device chip,
   wherein the light receiving device includes a back surface with a first back edge and a second back edge that extend in a direction of a second axis intersecting with the first axis,
   the first side surface of the light receiving device extends from the first back edge along a first reference plane,
   the second side surface of the light receiving device extends from the second back edge along a second reference plane,
   the back surface of the light receiving device extends along a third reference plane intersecting with the first axis, and
   the first reference plane and the second reference plane are inclined with respect to the third reference plane.

7. The method according to claim 6, further comprising the steps of:
   after forming the laminated device, forming a processed face in the light receiving device chip by applying a mechanical machining to a back surface of the compound semiconductor substrate of the laminated device; and before forming the light receiving device, forming the back surface of the light receiving device chip by etching the processed face of the light receiving device chip.

8. The method according to claim 6,
wherein, in the step of forming the light receiving device by applying the mechanical machining to the back surface of the light receiving device chip, the mechanical machining is applied to the semiconductor integrated device chip so as to produce a semiconductor integrated device from the semiconductor integrated device chip,
the semiconductor integrated device has a principal surface with a first upper edge and a second upper edge that extend in a direction of the second axis, and
the semiconductor integrated device has a first upper side face extending from the first upper edge along the first reference plane, and a second upper side face extending from the second upper edge along the second reference plane.

\* \* \* \* \*